(12) United States Patent
Fujiwara et al.

(10) Patent No.: US 7,659,604 B2
(45) Date of Patent: Feb. 9, 2010

(54) MODULE COMPONENT AND METHOD FOR MANUFACTURING THE SAME

(75) Inventors: Joji Fujiwara, Osaka (JP); Tsuyoshi Himori, Osaka (JP); Michiaki Tsuneoka, Osaka (JP)

(73) Assignee: Panasonic Corporation, Osaka (JP)

( * ) Notice: Subject to any disclaimer, the term of this patent is extended or adjusted under 35 U.S.C. 154(b) by 102 days.

(21) Appl. No.: 10/549,996

(22) PCT Filed: Mar. 17, 2005

(86) PCT No.: PCT/JP2005/004761
§ 371 (c)(1),
(2), (4) Date: Sep. 19, 2005

(87) PCT Pub. No.: WO2005/099331
PCT Pub. Date: Oct. 20, 2005

(65) Prior Publication Data
US 2006/0258050 A1    Nov. 16, 2006

(30) Foreign Application Priority Data
Mar. 30, 2004    (JP)    .............................. 2004-098934

(51) Int. Cl.
*H01L 23/552*    (2006.01)
(52) U.S. Cl. ........................ 257/659; 257/660; 257/795; 257/E23.114
(58) Field of Classification Search ................. 257/222, 257/700, 678, E21.502–E21.504, E23.002, 257/660, E23.114, 659, 790, 690, 795; 340/657; 361/695, 816, 818, 814; 174/250, 359, 527, 174/535; 455/325; 438/124–127; 29/841
See application file for complete search history.

(56) References Cited

U.S. PATENT DOCUMENTS

| 4,547,310 | A | * | 10/1985 | Kasanami et al. | ............ | 252/511 |
| 4,691,434 | A | * | 9/1987 | Percival et al. | .............. | 438/598 |
| 5,480,840 | A | * | 1/1996 | Barnes et al. | ............... | 438/107 |
| 5,796,164 | A | * | 8/1998 | McGraw et al. | ............. | 257/723 |
| 5,907,477 | A | * | 5/1999 | Tuttle et al. | .................. | 361/760 |
| 6,049,468 | A | * | 4/2000 | Learmonth | ................... | 361/816 |

(Continued)

FOREIGN PATENT DOCUMENTS

JP    59-028363    2/1984

(Continued)

OTHER PUBLICATIONS

International Search Report corresponding to International Application No. PCT/JP2005/004761, dated Mar. 17, 2005.

(Continued)

*Primary Examiner*—W. David Coleman
*Assistant Examiner*—Latanya Crawford
(74) *Attorney, Agent, or Firm*—RatnerPrestia

(57) ABSTRACT

A module component in which mounting components and a conductive partition for dividing into a plurality of circuit blocks are mounted on a substrate. The circuit blocks are covered with a sealing member, which is further covered on its surface with a conductive film to electrically shield the circuit blocks individually. This module component can maintain bending strength, with little warpage by a sufficient shielding effect achieved without increasing the number of manufacturing processes.

12 Claims, 7 Drawing Sheets

U.S. PATENT DOCUMENTS

| | | | | |
|---|---|---|---|---|
| 6,093,584 | A * | 7/2000 | Fjelstad | 438/127 |
| 6,380,491 | B1 * | 4/2002 | Witty | 174/250 |
| 6,472,598 | B1 * | 10/2002 | Glenn | 174/535 |
| 6,686,649 | B1 * | 2/2004 | Mathews et al. | 257/659 |
| 6,734,542 | B2 * | 5/2004 | Nakatani et al. | 257/687 |
| 6,815,810 | B2 * | 11/2004 | Takehara et al. | 257/687 |
| 6,884,938 | B2 * | 4/2005 | Aoyagi | 174/359 |
| 7,049,682 | B1 * | 5/2006 | Mathews et al. | 257/660 |
| 7,198,987 | B1 * | 4/2007 | Warren et al. | 438/112 |
| 7,402,502 | B2 * | 7/2008 | Yamada | 438/460 |
| 7,449,412 | B2 * | 11/2008 | Nuytkens et al. | 438/678 |
| 7,478,474 | B2 * | 1/2009 | Koga | 29/841 |
| 2002/0011907 | A1 * | 1/2002 | Yamada et al. | 333/204 |
| 2002/0051340 | A1 * | 5/2002 | Oda et al. | 361/695 |
| 2002/0053127 | A1 * | 5/2002 | Uchikoba | 29/601 |
| 2002/0080593 | A1 * | 6/2002 | Tsuge et al. | 361/818 |
| 2002/0111015 | A1 * | 8/2002 | Napolitano | 438/637 |
| 2002/0126018 | A1 * | 9/2002 | Warren | 340/657 |
| 2002/0168798 | A1 * | 11/2002 | Glenn et al. | 438/110 |
| 2003/0090883 | A1 * | 5/2003 | Asahi et al. | 361/761 |
| 2004/0070083 | A1 * | 4/2004 | Su | 257/778 |
| 2004/0160752 | A1 * | 8/2004 | Yamashita et al. | 361/766 |
| 2004/0178495 | A1 * | 9/2004 | Yean et al. | 257/723 |
| 2004/0226744 | A1 * | 11/2004 | Asahi et al. | 174/262 |
| 2004/0232452 | A1 * | 11/2004 | Tsuneoka et al. | 257/222 |
| 2004/0252475 | A1 * | 12/2004 | Tsuneoka et al. | 361/816 |
| 2005/0001331 | A1 * | 1/2005 | Kojima et al. | 257/778 |
| 2005/0017740 | A1 * | 1/2005 | Higashitani et al. | 324/751 |
| 2005/0088260 | A1 * | 4/2005 | Ajioka et al. | 333/247 |
| 2006/0158865 | A1 * | 7/2006 | Ohmi et al. | 361/795 |
| 2006/0258050 | A1 * | 11/2006 | Fujiwara et al. | 438/112 |
| 2007/0052091 | A1 * | 3/2007 | Weekamp et al. | 257/724 |

FOREIGN PATENT DOCUMENTS

| | | |
|---|---|---|
| JP | 63-131196 | 8/1988 |
| JP | 02-246199 | 10/1990 |
| JP | 06-097694 | 4/1994 |
| JP | 06-097694 A | 4/1994 |
| JP | 06-132547 | 5/1994 |
| JP | 06-252292 | 9/1994 |
| JP | 07-022541 | 1/1995 |
| JP | 07-022541 A | 1/1995 |
| JP | 09-008487 | 1/1997 |
| JP | 09-008487 A | 1/1997 |
| JP | 09-061456 | 3/1997 |
| JP | 09-061456 A | 3/1997 |
| JP | 11-150208 | 6/1999 |
| JP | 11-150391 | 6/1999 |
| WO | WO 00/13233 A | 3/2000 |

OTHER PUBLICATIONS

Supplementary European Search Report for Application No. EP 05 72 6702, Apr. 23, 2009, Panasonic Corporation.

* cited by examiner

US 7,659,604 B2

MODULE COMPONENT AND METHOD FOR MANUFACTURING THE SAME

THIS APPLICATION IS A U.S. NATIONAL PHASE APPLICATION OF PCT INTERNATIONAL APPLICATION PCT/JP2005/004761.

TECHNICAL FIELD

The present invention relates to a module component provided with an electrical shield, which is used for electronic and communication devices of different types, and also relates to a method for manufacturing the module component.

BACKGROUND OF THE INVENTION

A method for manufacturing a conventional module component having an electrical shield is shown in FIG. 14. First, substrate 1 is mounted with mounting components 3 (S141), and then covered with sealing member 4 made of resin (S142). Substrate 1 covered with sealing member 4 is then provided with dividing groove 6 to divide mounting components 3 into desired circuit blocks (S143). Sealing member 4 and dividing groove 6 are coated with metal film 2 on their surfaces by plating or the like (S144) so as to obtain the module component. Metal film 2 has an electrical shielding effect by being connected with ground pattern 5 of substrate 1 and also has the effect of shielding the circuit blocks individually. One such circuit module in which a plurality of circuit blocks are shielded individually is disclosed in Japanese Patent Unexamined Publication No. 11-150391.

However, the conventional electrical shield structure must have dividing groove 6 to divide substrate 1 into desired circuit blocks so as to make metal film 2 and ground pattern 5 electrically continuous with each other. This requires making a cut on substrate 1 as deep as to reach the second layer of ground pattern 5. The provision of this cut makes it hard to maintain the bending strength and to reduce warpage of the module component. As a result, the wiring between the circuit blocks becomes vulnerable to breakage, thereby causing defective circuit operation. To overcome this defect, dividing groove 6 can be filled with resin to prevent the module component from decreasing in strength; however, this approach requires an additional process of filling in the resin, thereby leading to cost increase.

SUMMARY OF THE INVENTION

In a module component of the present invention, mounting components and a conductive partition for dividing the mounting components into a plurality of circuit blocks are mounted on a substrate. The circuit blocks partitioned by the partition are covered with a sealing member, and then a conductive film is formed on the surface of the sealing member. This structure provides electrical shielding to the circuit blocks individually from each other, and the module circuit can have a sufficient bending strength and shielding effect. The absence of a dividing groove to be formed for shielding predetermined circuit blocks individually makes the module component free of defects in the circuit operation.

Figure 1:
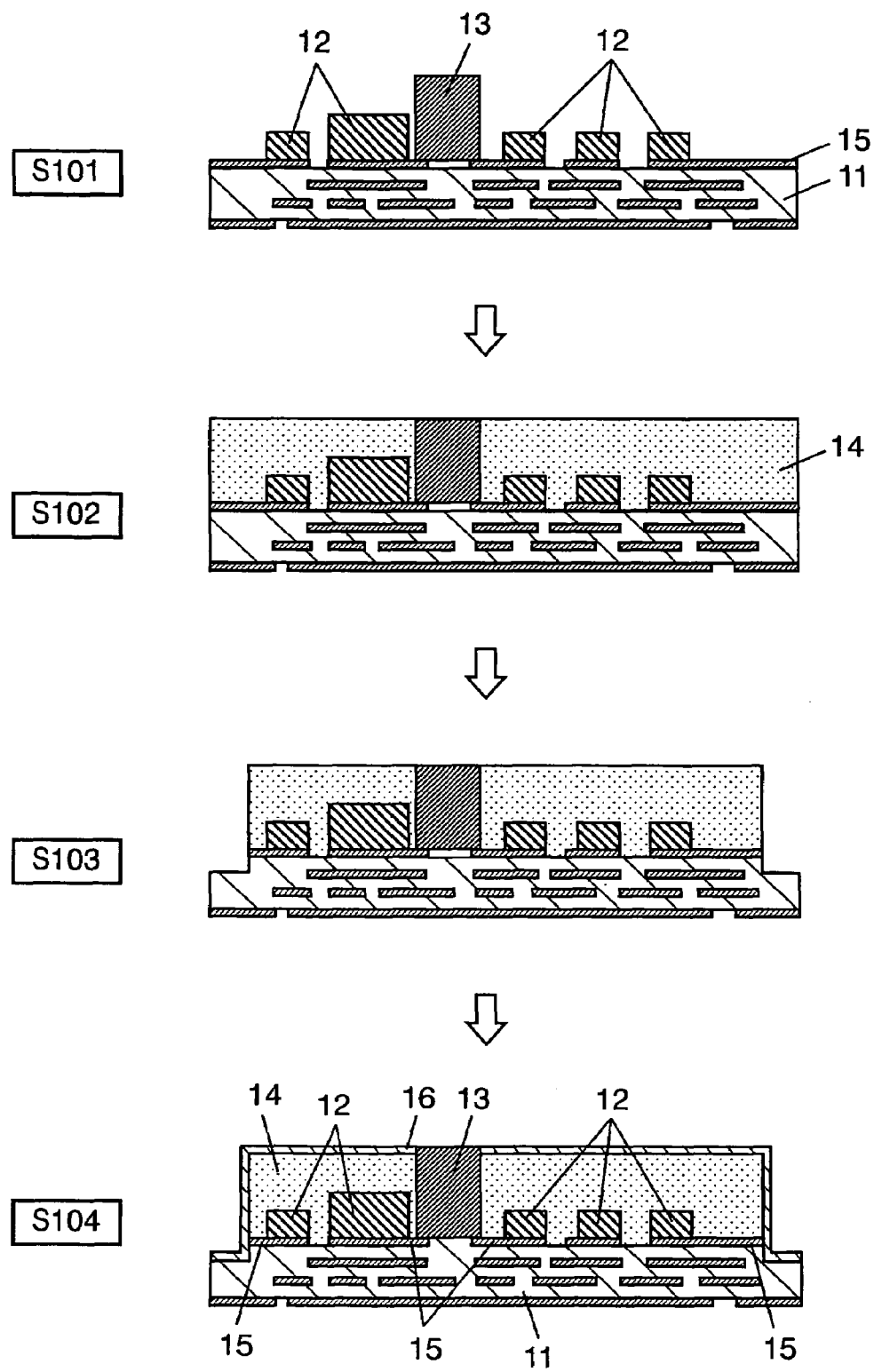
FIG. 1 shows a manufacturing process of a module component according to an embodiment of the present invention.

REFERENCE MARKS IN THE DRAWINGS 11, 11A, 11B substrate
12 mounting component
13 partition
14 sealing member
15 ground pattern
16 conductive film
201, 601 module component
31, 32 circuit
210, 220 circuit block

DETAILED DESCRIPTION OF PREFERRED EMBODIMENTS

The module component of the present invention shields a plurality of circuit blocks individually by providing a partition instead of a dividing groove on a substrate. The absence of the dividing groove can secure the bending strength of the module component, reduce defects such as warpage and wiring breakage between circuit blocks, and provide a sufficient shielding effect. The absence can also simplify the manufacturing process of the module component and make the shielding flexible in shape.

The module component of an embodiment of the present invention will be described as follows with reference to drawings.

Figure 2:
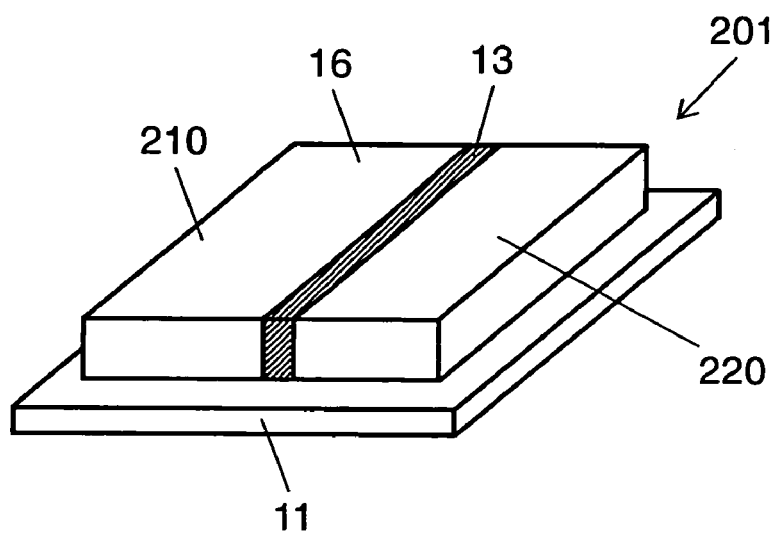
FIG. 2 is a perspective view of the module component according to the embodiment of the present invention.

FIG. 1 show a manufacturing process of the module component of the embodiment of the present invention, and FIG. 2 is a perspective view of the manufactured module component.

In Step S101, substrate 11 made of resin is mounted with mounting components 12 and partition 13. Partition 13 made of conductive material is formed on a predetermined area of substrate 11, with a shape to fit the corresponding circuit blocks. Substrate 11 is provided with two or more of wiring layers including a power supply, a ground and a high frequency circuit pattern, and is also provided with ground pattern 15 on the outer surface thereof.

In the present embodiment, substrate 11, which is an assembly of individual chips of module, has at least as many partitions 13 as necessary for the number of the individual chips in reality. The conductive material used for partitions 13 can be electrically conductive material such as metal and conductive resin.

One example of the conductive resin is a composition of plastic with conductive filler. Examples of the plastic include: general-purpose plastics such as polypropylene (PP) or polystyrene (PS); general-purpose engineering plastics such as nylon; special-purpose engineering plastics such as polyethersulfone (PES), polyetheretherketone (PEEK) or liquid crystal polymer; and thermoplastic elastomer such as polyester elastomer or polystyrene elastomer. Examples of the conductive filler include: metal powders such as stainless microfiber, carbon fiber, carbon black, copper, nickel and silver.

In Step S102, substrate 11 is covered with sealing member 14 whose top is polished to make it flat.

Sealing member 14 can be made of electrically insulating mold resins such as epoxy resin, unsaturated polyester resin, polyamide resin and polybutylene terephthalate resin.

In Step S103, substrate 11 is cut into individual chips of module.

In Step S104, sealing member 14 is covered with conductive film 16 except for the surface of partition 13. At this moment, the conductive film thus formed is made continuous with at least part of ground pattern 15. This results in the completion of a module component provided with an electrical shield shaped to fit the corresponding circuit blocks on substrate 11.

FIG. 2 shows a circuit module divided into two blocks. Module component 201 can secure the shielding effect between the circuit blocks because sealing member 14 covered with conductive film 16 is divided into circuit block 210 and circuit block 220 by partition 13.

Partition 13 may be made of a conductive material only, a composition of a resin and a conductive material, or a complex of a resin and a conductive material. In the case where the material of partition 13 contains resin, sealing member 14 is preferably made of the same resin. By making partition 13 and sealing member 14 from the same material and by adjusting the thermal expansion coefficient of partition 13 with that of sealing member 14, more effective prevention of warpage of the module component is attained.

Substrate 11 may be made of ceramic instead of resin. In that case, partition 13 is preferably made of a composition of resin with ceramic powder and conductive material. Making sealing member 14 from the same composition as that of partition 13 allows the thermal expansion coefficient of their material to be more similar to that of the ceramic substrate, thereby effectively preventing warpage of the module component. Using such a ceramic substrate can improve the bending strength of the module component.

The conductive material used for partition 13 can be connected with ground pattern 15 on substrate 11 at the periphery of each circuit block without clearance to obtain a shielding effect large enough to reduce signal and noise interferences between the circuit blocks.

In the present embodiment, when the shield is made of conductive material as thin as a metal foil, partition 13 can be reduced in thickness. A decrease in the area occupied by partition 13 on substrate 11 can reduce the whole size of the module component. In the case where a conductive resin is used, the low thermal expansion coefficient of the conductive resin can prevent the partition from being damaged due to thermal expansion when the module component is heated.

Figure 3:
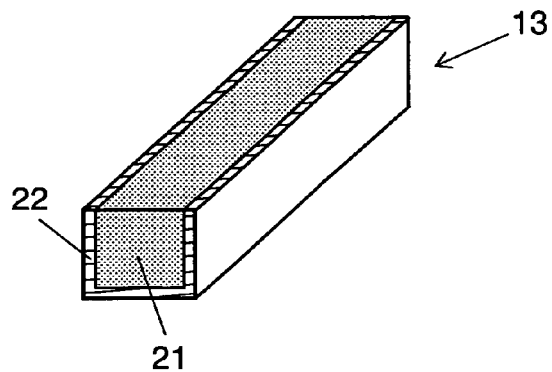
FIG. 3 is a perspective view of a partition of the embodiment of the present invention.

As shown in FIG. 3, the present embodiment can use partition 13 made of resin 21 whose longitudinal cross section is square-shaped and whose periphery is covered with metal film 22. This structure can further secure the electric connection between ground pattern 15 of substrate 11 and partition 13, thereby improving the yield in the manufacture of the module component.

Figure 4:
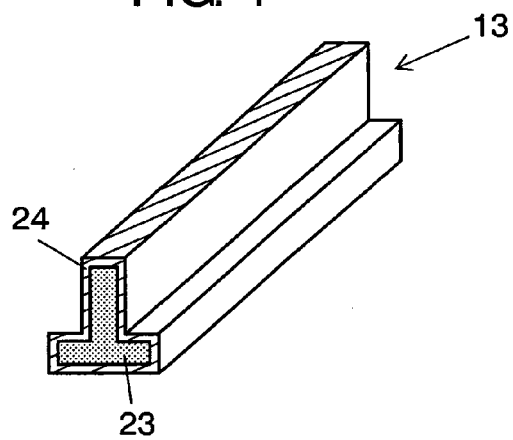
FIG. 4 is a perspective view of a partition of the embodiment of the present invention.

As shown in FIG. 4, the longitudinal cross section of partition 13 made of resin 23 having metal film 24 on the periphery may be a shape with a protruding base which is adjacent to substrate 11, like an inverted T-shape or an L-shape. These shapes can further secure the electric connection between ground pattern 15 of substrate 11 and partition 13, thereby improving the yield in the manufacture of the module component.

Figure 5:
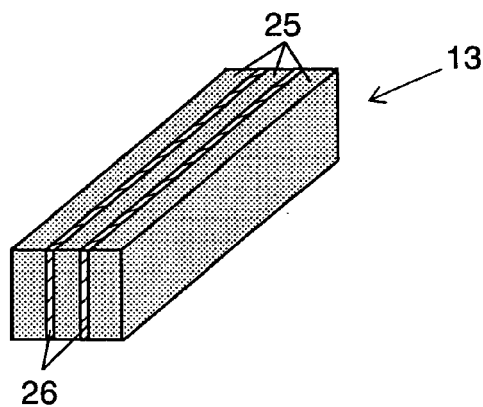
FIG. 5 is a perspective view of a partition of the embodiment of the present invention.

It is also possible to use partition 13 shown in FIG. 5, which is formed by stacking metal films 26 functioning as conductive barriers and resin 25. Metal films 26 are formed nearly parallel to the longitudinal direction of partition 13 and vertical to the substrate. The term "longitudinal direction" used here corresponds to the direction parallel to the boundary of adjacent circuit blocks. In FIG. 5, two metal films 26 are used; however, single metal film 26 can be provided depending on the use, or more than two metal films 26 can be provided in order to achieve a sufficient shielding effect.

In the present embodiment, after mounting components are mounted in such a manner as to make ground pattern 15 of substrate 11 continuous with the conductive material of partition 13, sealing member 14 is formed. Then, the top surface of sealing member 14 is polished to provide surface smoothness to the module component. In the polishing, the conductive material formed in the vertical direction of partition 13 is exposed on the surface. This exposure of the conductive material allows conductive film 16 formed later on the surface of sealing member 14 to be continuous with ground pattern 15 of substrate 11 via partition 13 having conductivity, thereby providing a shielding effect large enough to reduce signal and noise interferences between the circuit blocks.

Partition 13 shown in FIG. 5 has electrically insulating resin on its side surfaces. This insulating resin can prevent an electrode of mounting component 12 that is in the vicinity of the partition on substrate 11 from being electrically connected with the conductive material of partition 13, thereby preventing the module component from having defects in the circuit operation.

In partition 13 of the present embodiment, conductive film 16 is connected on the surface of ground pattern 15. Furthermore, the conductive material exposed on the surface of partition 13 may be electrically connected with at least part of the surface of ground pattern 15 by soldering or conductive resin. This can further secure the connection between ground pattern 15 and conductive film 16, thereby providing a sufficient shielding effect between the circuit blocks.

An example of applying the module component of the present invention to an RF module for mobile phones will be described as follows with reference to FIGS. 6 and 7.

Figure 6:
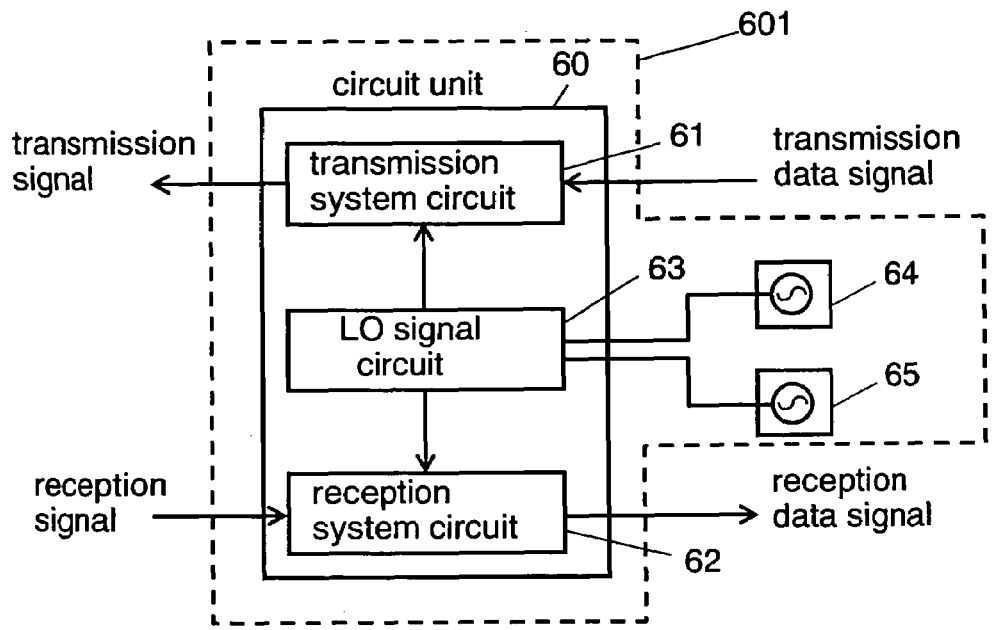
FIG. 6 is an RF block diagram of a module component according to the embodiment of the present invention.
Figure 7A:
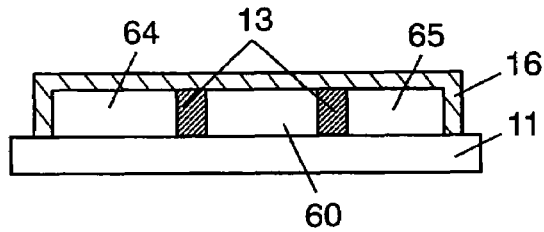
FIG. 7A is a cross sectional view of an RF module component according to the embodiment of the present invention.
Figure 7B:
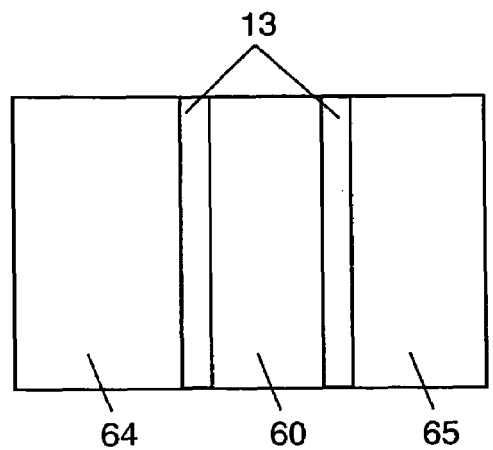
FIG. 7B is a plan view of the RF module component according to the embodiment of the present invention.

FIG. 6 is a block diagram of the RF module, FIG. 7A is a cross sectional view of a module component, and FIG. 7b is a plan view of the module component. Module component 601 is an integrated module component of circuit unit 60 and voltage control oscillators (VCOs). Circuit unit 60 of a mobile phone includes transmission system circuit 61, reception system circuit 62 and an LO (Local Oscillator) signal circuit. Voltage control oscillators (VCOs) are connected to LO (Local Oscillator) signal circuit 63. In the case where one module component 601 is provided with a plurality of circuit block functions, there is an issue of interference between first VCO 64 and second VCO 65, or between first or second VCO 64 or 65 and a transmission or reception signal. However, the module component of the present invention can prevent these interferences. More specifically, using the module component of the present invention can improve the modulation accuracy and SIN of transmission signals, and the receiver sensitivity characteristics of the reception system circuit unit.

It has been conventional to shield VCOs separately from the other units, and to shield the whole module component after the separate shielding of the VCOs. This causes an increase in the size as well as height of the module component. The present invention can solve this problem, thereby achieving a smaller, lower-profile module component.

Figure 8:
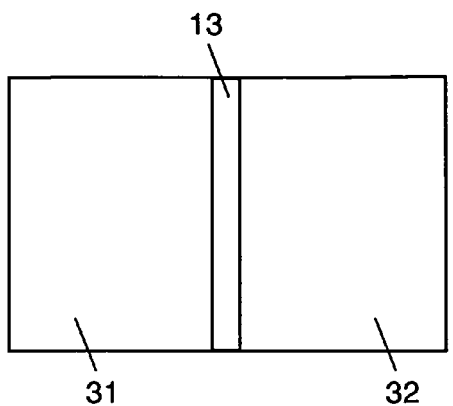
FIG. 8 is a plan view of a module component according to the embodiment of the present invention.

As shown in FIG. 8, a circuit module may consist of independent circuit blocks having a different function from each other. For example, in the module component shown in FIG. 8, which is mounted with circuit 31 for Bluetooth (a registered trademark of Bluetooth-SIG Inc.) and circuit 32 for FM tuner together, circuits 31 and 32 can concurrently operate without mutual interference. Furthermore, the module component can be smaller in size than in the case of mounting circuits 31 and 32 on different module circuits.

Figure 9:
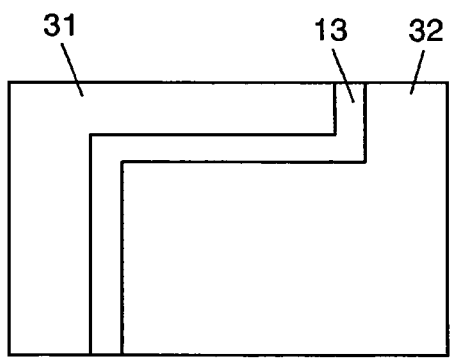
FIG. 9 is a plan view of a module component according to the embodiment of the present invention.

The circuit module shown in FIG. 8 has circuit blocks containing circuit 31 and circuit 32, respectively, which are partitioned by linear partition 13. On the other hand, partition 13 can be other than linear as shown in FIG. 9 so as to form the shield structure between the circuit blocks freely and easily. A conventional approach is to divide into circuit blocks by dicing; however, in this approach, the dividing groove must be liner. Another conventional approach is to form a dividing groove by laser processing. This approach, however, has some disadvantages, e.g. it is difficult to control the depth of the dividing groove and the laser processing is time-consuming. In contrast, the module component of the present invention can have a partition with a desired shape, thereby allowing the shield of the circuit blocks to be designed freely.

Figure 10:
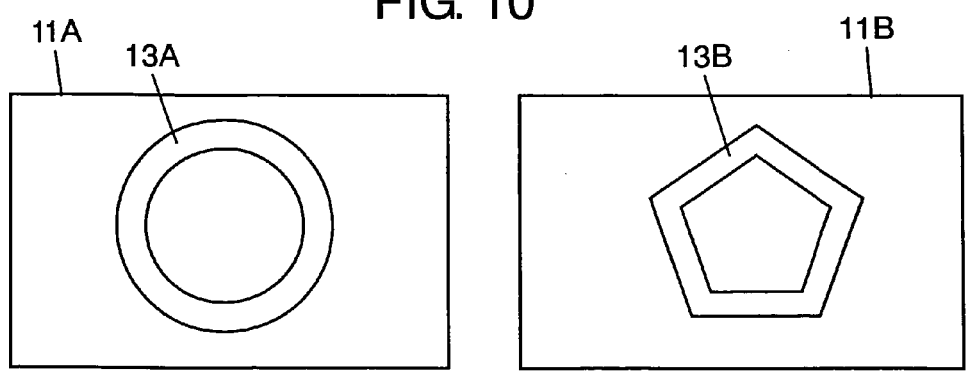
FIG. 10 is a plan view of a partition of a module component according to the embodiment of the present invention.

For example, as shown in FIG. 10, substrates 11A and 11b can have circular partition 13A and polygonal partition 13B, respectively, inside them. This enables a circuit block affecting another circuit block to be shielded regardless of its layout. Circular partition 13A and polygonal partition 13B shown in FIG. 10 may be in contact with edges of substrates 11A and 11B, respectively.

Figure 11:
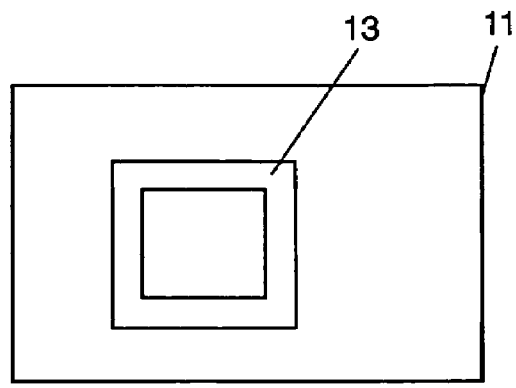
FIG. 11 is a plan view of a partition of a module component according to the embodiment of the present invention.

As shown in FIG. 11, a module component can have partition 13 positioned out of contact with an outer edge of substrate 11, thereby providing a shield exclusively to a circuit block that causes unnecessary signals or noise for other circuit blocks.

Figure 12:
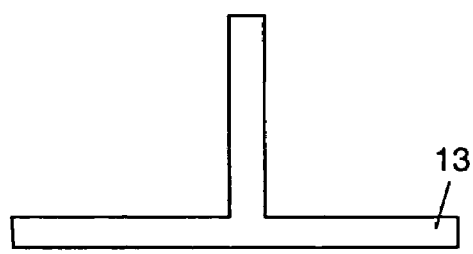
FIG. 12 is a plan view of a partition of a module component according to the embodiment of the present invention.
Figure 13:
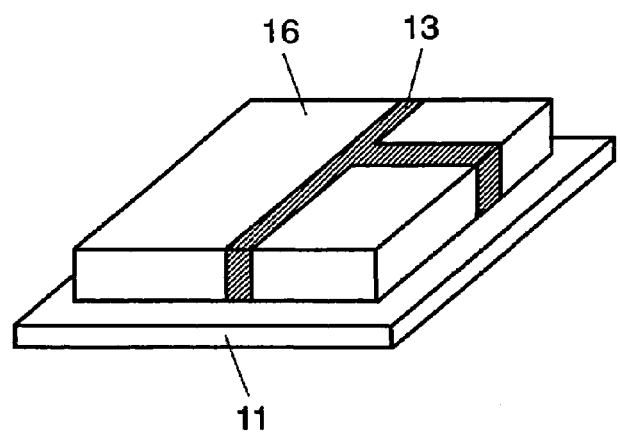
FIG. 13 is a perspective view of a module component according to the embodiment of the present invention.
Figure 14:
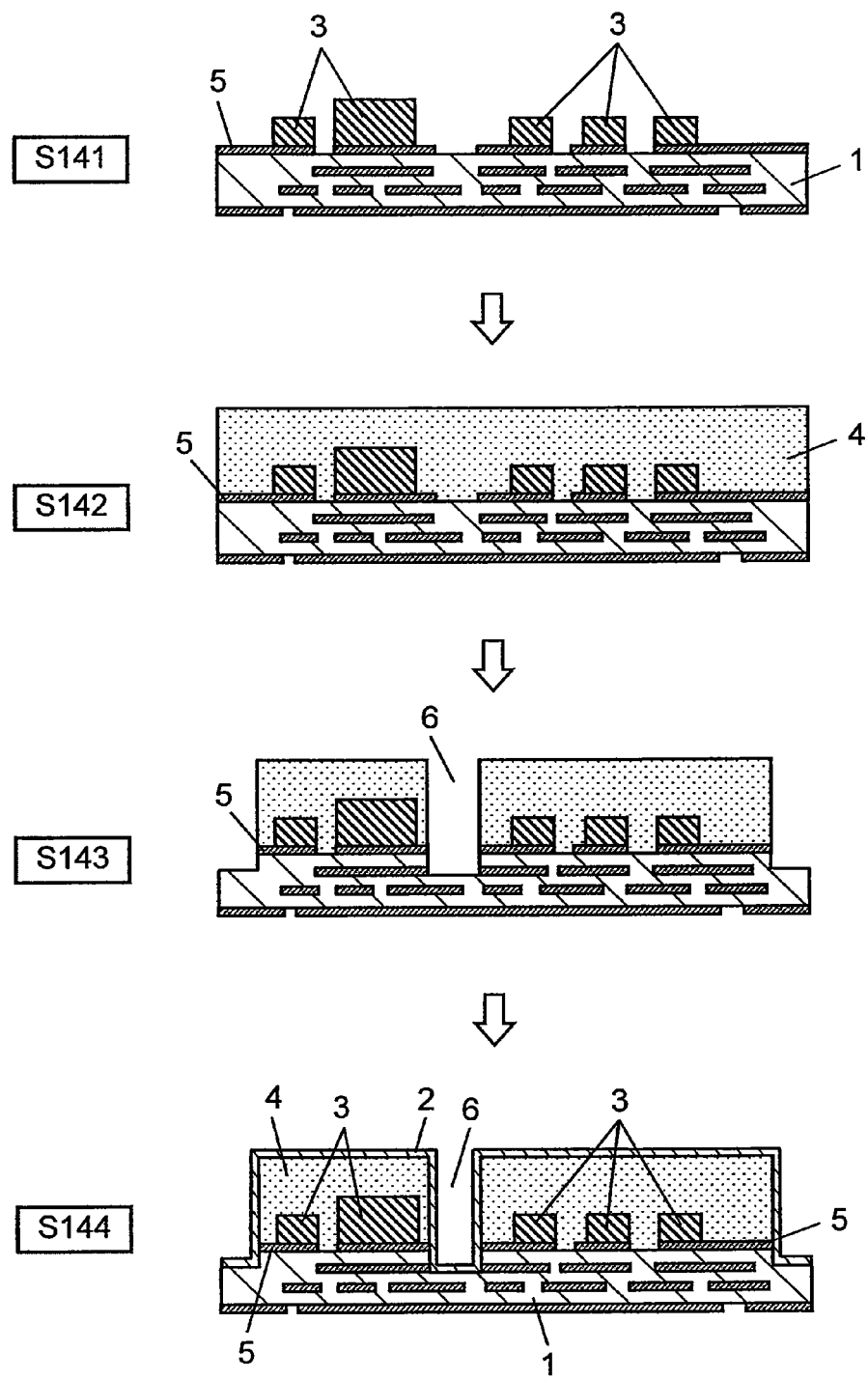
FIG. 14 shows a manufacturing process of a conventional module component.

As shown in FIG. 12, using partition 13 having a T-shaped planar surface makes it possible for the module component to have at least two divided circuit blocks. FIG. 13 shows a module component having three circuit blocks.

Conductive film 16 covering sealing member 14 may be formed by plating the module component covered with sealing member 14. Plating facilitates the formation of the shield. One example of the plating is electroless plating.

In forming the module component, the conductive material in the top of the partition can be removed by dicing or laser. This approach enables a shielded circuit block whose interference should be avoided to be separated from other circuit blocks, thereby increasing the shielding effects between the circuit blocks.

As described hereinbefore, according to the present invention, circuits formed on the substrate are divided into a plurality of circuit blocks by using a partition, so as to electrically shield the individual circuit blocks. In addition, it is unnecessary to form a groove on the circuit substrate for its division, so that the module component can maintain the bending strength without warpage.

INDUSTRIAL APPLICABILITY

The module component of the present invention, which can maintain bending strength and warpage and can provide a sufficient shielding effect, is useful as a module component having a plurality of circuit blocks.

The invention claimed is:

1. A module component comprising:

a substrate a partition formed on the substrate, the partition having a predetermined height to divide the substrate into a plurality of circuit blocks;

a first sealing member covering a first circuit block of the plurality of circuit blocks;

a second sealing member covering a second circuit block of the plurality of circuit blocks;

a first conductive film covering at least a surface of the first sealing member and being continuous from the partition to the substrate; and a second conductive film covering at least a surface of the second sealing member and being continuous from the partition to the substrate;

the plurality of circuit blocks are electrically shielded individually and the partition is made of a composition of a resin and an electrically conductive material;

the substrate is made of resin; and the first sealing member, the second sealing member and the partition contain a same resin.

2. The module component according to claim 1, wherein the conductive material of the partition is a conductive resin.

3. A module component comprising:

a substrate a partition formed on the substrate, the partition having a predetermined height to divide the substrate into a plurality of circuit blocks;

a first sealing member covering a first circuit block of the plurality of circuit blocks;

a second sealing member covering a second circuit block of the plurality of circuit blocks;

a first conductive film covering at least a surface of the first sealing member and being continuous from the partition to the substrate; and a second conductive film covering at least a surface of the second sealing member and being continuous from the partition to the substrate;

the plurality of circuit blocks are electrically shielded individually and the partition is made of a composition of a resin and an electrically conductive material;

the substrate is ceramic;

the composition is made of ceramic powder-containing resin and conductive material; and the first sealing member, the second sealing member and the partition contain a same resin.

4. The module component according to claims 1 or 3, wherein the partition is resin having a metal film formed on an outer surface thereof, and has a square cross section in a longitudinal direction.

5. The module component according to claims 1 or 3, wherein the partition has a conductive wall in a direction vertical to the substrate.

6. The module component according to claims 1 or 3, wherein the partition has resin at least one side surface thereof.

7. The module component according to claims 1 or 3, wherein the partition is positioned inside the substrate, and has a planar shape of one of a circle and a polygon.

8. The module component according to claims 1 or 3, wherein the partition has a planar shape of a letter T.

9. The module component according to claims 1 or 3, wherein either a) the first conductive film and the second conductive film include metal or b) the first conductive film and the second conductive film include conductive resin.

10. The module component according to claims 1 or 3, wherein the partition is higher than an electric component mounted on the substrate.

11. The module component according to claims 1 or 3, wherein the substrate has a ground pattern on a surface thereof, and the ground pattern is connected with the first conductive film and the second conductive film.

12. The module component according to claim 7, wherein the partition is positioned out of contact with an outer edge of the substrate.

* * * * *

UNITED STATES PATENT AND TRADEMARK OFFICE
CERTIFICATE OF CORRECTION

| | | |
|---|---|---|
| PATENT NO. | : 7,659,604 B2 | Page 1 of 1 |
| APPLICATION NO. | : 10/549996 | |
| DATED | : February 9, 2010 | |
| INVENTOR(S) | : Joji Fujiwara et al. | |

It is certified that error appears in the above-identified patent and that said Letters Patent is hereby corrected as shown below:

On the Title Page, Item [56], References Cited, Page 2 of FOREIGN PATENT

DOCUMENTS please delete the following duplicate references.

"JP 06-097694   4/1994
JP 07-022541   1/1995
JP 09-008487   1/1995
JP 09-061456   3/1997"

Signed and Sealed this

Thirtieth Day of November, 2010

David J. Kappos
*Director of the United States Patent and Trademark Office*